(12) United States Patent
Moriya et al.

(10) Patent No.: US 6,698,096 B2
(45) Date of Patent: Mar. 2, 2004

(54) METHOD FOR MANUFACTURING A PIEZOELECTRIC FILM ELEMENT AND AN INK-JET RECORDING HEAD

(75) Inventors: Souichi Moriya, Nagano (JP); Qiu Hong, Nagano (JP); Kouji Sumi, Nagano (JP)

(73) Assignee: Seiko Epson Corporation (JP)

( * ) Notice: Subject to any disclaimer, the term of this patent is extended or adjusted under 35 U.S.C. 154(b) by 111 days.

(21) Appl. No.: 09/964,495

(22) Filed: Sep. 28, 2001

(65) Prior Publication Data

US 2002/0149651 A1 Oct. 17, 2002

Related U.S. Application Data

(62) Division of application No. 09/235,488, filed on Jan. 22, 1999, now Pat. No. 6,328,433.

(30) Foreign Application Priority Data

Jan. 22, 1998 (JP) .............................................. 10-10611
Mar. 30, 1998 (JP) .............................................. 10-83061

(51) Int. Cl.$^7$ ................................................ B23P 17/00
(52) U.S. Cl. ........................ 29/890.1; 29/592.1; 29/825
(58) Field of Search ................................. 310/358, 311, 310/326, 327; 29/890.1, 825, 592.1

(56) References Cited

U.S. PATENT DOCUMENTS

| | | | |
|---|---|---|---|
| 5,500,988 A | * 3/1996 | Moynihan et al. | 29/25.35 |
| 5,691,752 A | * 11/1997 | Moynihan et al. | 347/68 |
| 5,847,723 A | * 12/1998 | Akahira et al. | 347/14 |
| 5,962,955 A | * 10/1999 | Tsukada et al. | 310/366 |
| 6,097,133 A | * 8/2000 | Shimada et al. | 310/358 |
| 6,140,746 A | * 10/2000 | Miyashita et al. | 310/358 |

FOREIGN PATENT DOCUMENTS

JP  6-40035  2/1994

OTHER PUBLICATIONS

Klee, M., et al., "Analytical Study of the growth of Polycrystalline Titanate Thin Films," Philips Journal of Research vol. 47, Nos. 3–5:263–285 (1993).

Kumar et al., "Lead Zirconate Titanate Films by Rapid Thermal Processing," Appl. Phys. Lett. 58 (11), Mar. 18, 1991, pp. 1161–1163.

Impey et al., "Microstructural Characterization of Sol–Gel Lead–Zirconate–Titanate Thin Films," Journal of Applied Physics, vol. 83, No. 4, pp. 2202–2208.

* cited by examiner

*Primary Examiner*—Carl J. Arbes
*Assistant Examiner*—Tai V Nguyen
(74) *Attorney, Agent, or Firm*—Sterne, Kessler, Goldstein & Fox P.L.L.C.

(57) ABSTRACT

A method for manufacturing a piezoelectric film element with increased durability is disclosed. The method of manufacturing the piezoelectric film element includes the steps of thermally treating a first film, and thermally treating a second film formed over the first film; whereby a dislocation layer is formed in the second film in a vicinity of an interface between the first film and the second film. Additionally, an ink-jet recording head including a pressure room substrate, a pressure room, and a piezoelectric film element is disclosed. The method of manufacturing the ink-jet recording head includes the steps of forming a pressure room in a pressure room substrate and manufacturing a piezoelectric film element at a position which makes it possible to press the pressure room.

5 Claims, 11 Drawing Sheets

△: LATTICE DEFECT

METHOD FOR MANUFACTURING A PIEZOELECTRIC FILM ELEMENT AND AN INK-JET RECORDING HEAD

BACKGROUND OF THE INVENTION

1. Field of the Invention

This invention relates to a structure of a piezoelectric film which composes a piezoelectric film element. More particularly, this invention relates to a structure of a piezoelectric film element which is preferable for a drive source for discharging ink for an ink-jet recording head.

2. Description of the Related Art

An ink-jet recording head of an on-demand type comprises a piezoelectric film element which functions as a drive source for discharging ink. This piezoelectric film element comprises a piezoelectric film made of piezoelectric ceramics, and an upper electrode and a lower electrode to hold the piezoelectric film in between. The application of a desired electric field to the piezoelectric film element causes changes in volume, while the application of pressure causes changes in voltage. Since many piezoelectric ceramics with a perovskite crystal structure remarkably exhibit the above-described action, such piezoelectric ceramics are used as materials for the piezoelectric film. The piezoelectric film element provided with such a crystal structure is disclosed in, for example, Applied Physics Letters, 1991, Vol. 58, No. 11, p.p. 1161–1163. A prior art example of the ink-jet recording head using the piezoelectric film element is disclosed in, for example, a specification of U.S. Pat. No. 5,265,315.

Since the ink-jet recording head in these days are being required to achieve higher precision printing, the volume of a pressure room is getting smaller. In order to make the pressure room with the small volume discharge ink in an appropriate amount, it is necessary to cause higher pressure in the piezoelectric film element. This pressure is generated as accumulation of very little strains in individual crystal structures. Accordingly, it is supposed that as the thickness of the piezoelectric film is increased, higher pressure can be obtained. Moreover, by increasing the thickness of the piezoelectric film, it is possible to prevent the lowering of piezoelectric properties due to the generation of a strong electric field in the piezoelectric film. Therefore, attempts are being made to increase the thickness of the piezoelectric film by various film forming methods.

A piezoelectric film which is generally used has: a two-component composition containing lead zirconate titanate (hereinafter sometimes referred to as "PZT") as a principal component; or a three-component composition prepared by adding a third component of PZT to the two-component composition. As a method for forming the piezoelectric film, for example, "JOURNAL OF APPLIED PHYSICS" (Vol. 83, Number 4, Feb. 15, 1998, p.p. 2202–2208) discloses the technique to form, by a sol-gel method, a film of $Pb(Zr_{0.30}Ti_{0.70})O_3$(PZT30/70) over an electrode made of platinum/titanium in the temperature environment of 510° C.

This sol-gel method is the method of giving dehydration treatment to a hydrate complex (sol) of a hydroxide of a metal component of a PZT type piezoelectric film to turn it into a gel and of heating and burning the gel to adjust an inorganic oxide (piezoelectric film). This method makes it possible to form the film by repeating the coating, drying and pyrolyzing of a precursor of the PZT type piezoelectric film for several times until a specified thickness is obtained. Accordingly, this method is excellent in the composition control and is preferred for the adjustment of the thickness of the piezoelectric film. Moreover, patterning using a photoetching step is also possible and has actually been applied to an ink-jet recording head.

For example, when a PZT film with a thickness of about 0.4 $\mu$m is to be formed by the sol-gel method, the step of spin coating, drying and pyrolyzing a sol for the PZT film is repeated for several times (for example, four times) and the step of RTA thermal treatment (final annealing) is then taken, thereby obtaining the desired PZT film.

However, the inventors of this invention have found that if the piezoelectric film is formed by the above-described sol-gel method and if an attempt is made to increase the film thickness to a certain degree, residual stress affects the inside of the piezoelectric film and cracks may be sometimes generated on the surface of the film when crystal grains are caused to grow in the pyrolyzing step and the RTA step. It is assumed that this phenomenon is caused because heat stresses act upon each other in a complicated manner when a molecular structure which is in the amorphous state in the pyrolyzing step or the RTA step of the piezoelectric film is turned into a minute crystal structure. Accordingly, it has been impossible to form a piezoelectric film with a large film thickness beyond a certain degree and technical limitations have been imposed upon the achievement of high precision of the ink-jet recording head.

SUMMARY OF THE INVENTION

It is an object of this invention to provide a piezoelectric film element having structural characteristics that make it possible to prevent the generation of cracks in the step of manufacturing the piezoelectric film element and to increase the thickness of a piezoelectric film, and also to provide a method for manufacturing such a piezoelectric film element. It is another object of this invention to provide an ink-jet recording head which has excellent ink discharging properties and to provide a method for manufacturing such an ink-jet recording head. It is a further object of this invention to provide an ink-jet printer which has excellent ink discharging properties.

In order to attain the above-described objects, a piezoelectric film element of this invention comprises a dislocation layer in a piezoelectric film. This "dislocation layer" is the layer of which atoms in crystals are partly defective, which is caused by lattice defects. It is desirable that a dislocation density in the dislocation layer be within the range of $10^{13}/cm^2$ to $10^{14}/cm^2$. This is because the structural strength of the piezoelectric film lowers if the dislocation density is more than $10^{14}/cm^2$, while stresses caused within the film may not be relaxed if the dislocation density is less than $10^{13}/cm^2$. It is also desirable that the dislocation layer be formed with a thickness ranging from 5 nm to 15 nm, more preferably 10 nm, in a thickness direction of the piezoelectric film. This is because the stresses caused in the film may not be relaxed if the thickness is less than 5 nm, while the structural strength of the piezoelectric film lowers if the thickness is more than 15 nm. It is particularly desirable that the piezoelectric film have a plurality of dislocation layers in its film thickness direction and that the dislocation layers be formed in a manner such that the distances between the adjacent dislocation layers are the same or gradually become shorter from the lower electrode side to the upper electrode side. As stresses caused at the time of formation of the piezoelectric film strongly affect the surface of the piezoelectric film (on the upper electrode side), the above-described structure causes the piezoelectric film to contain many dislocation layers in the vicinity of the surface of the piezoelectric film. Accordingly, the stresses caused at the time of formation of the piezoelectric film can be effectively relaxed. Therefore, it is possible to increase the thickness of the piezoelectric film. Moreover, it is possible to improve the yield of the piezoelectric film element, thereby reducing manufacturing costs.

The piezoelectric film element of this invention can be manufactured by a sol-gel method. Specifically speaking, the step of giving thermal treatment to a first film formed with a sol for forming a piezoelectric film precursor applied not less than once, and then giving thermal treatment to a second film formed with the sol applied over the first film not less than once, thereby forming a dislocation layer in the second film in the vicinity of an interface between the first film and the second film, is repeated for m times, and the m dislocation layers are formed in the film thickness direction of the piezoelectric film in a manner such that the distances between the adjacent dislocation layers are the same or gradually become shorter from the lower electrode side to the upper electrode side. As a result of the thermal treatment (pre-annealing) of the first film, the lattice arrangement over the surfaces of crystal grains of the sol is disturbed moderately when the crystal grains grow. Accordingly, the dislocation layer can be formed in the second film. When a plurality of dislocation layers are to be formed in the piezoelectric film, the step of applying the sol and the step of thermal treatment should be repeated more than once.

The piezoelectric film element of this invention can be used for an ink-jet printer which obtains desired visible images by selectively causing ink drops to be spattered and fixed over recording paper in accordance with print data to be inputted. An ink-jet recording head of this invention comprises: a pressure room substrate including a pressure room; and a piezoelectric film element of this invention as located at a position which makes it possible to press the pressure room. A method for manufacturing an ink-jet recording head of this invention comprises the steps of: forming a pressure room in a pressure room substrate; and manufacturing a piezoelectric film element at a position which makes it possible to press the pressure room by the method for manufacturing a piezoelectric film element of this invention.

An ink-jet printer of this invention comprises: a paper feed for feeding printing paper; an ink-jet recording head of this invention; a drive mechanism for scanning the ink-jet recording head over the paper; a storage means for storing print information; and a controller for reading print information from the storage means and for controlling the ink discharge of the ink-jet recording head and the scanning of the drive mechanism.

DESCRIPTION OF THE PREFERRED EMBODIMENTS

Figure 1:
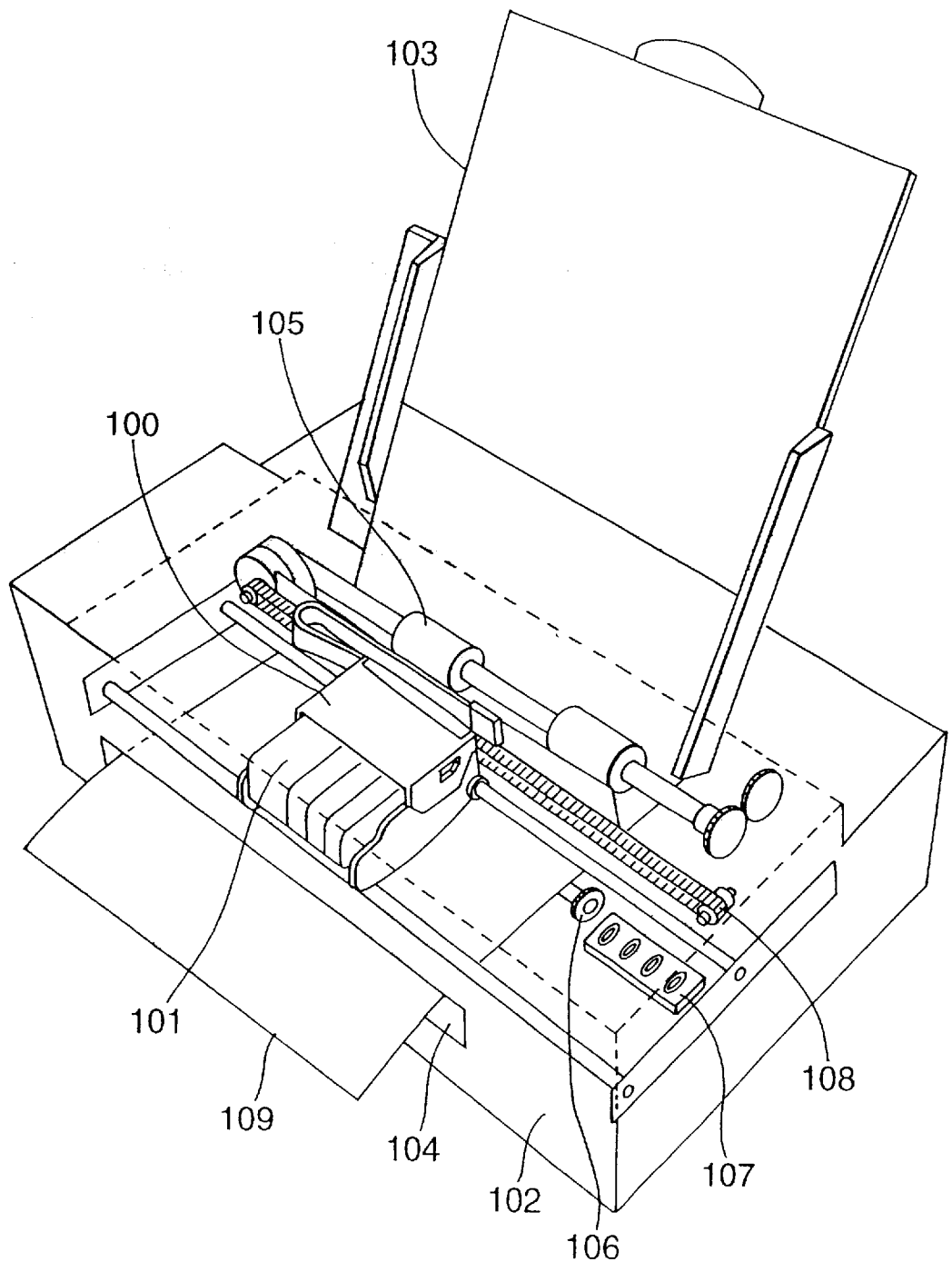
FIG. 1 is a structural view of an ink-jet printer.

Preferred embodiments of this invention are hereinafter explained with reference to the respective drawings. First, the structure of an ink-jet printer is explained with reference to FIG. 1. The ink-jet printer is composed of, as main components, an ink-jet recording head 100, a body 102, and a tray 103. The ink-jet recording head 100 comprises an ink cartridge 101 of four colors, that is, yellow, magenta, cyan and black so that full-color printing can be performed.

This ink-jet printer can be used through connection to a network (LAN). For example, if this ink-jet printer has a printer server function, it performs printing while organizing print instructions from each client connected to the network. In this case, print information sent by clients is stored in a memory contained in the printer. This memory is used, for example, to store print images, to serve as a work area for image preparation, and to buffer data. A CPU reads the print information from the memory and develops print images at a specified address in the memory. A head drive mechanism 108 scans the ink-jet recording head 100 in a widthwise direction of paper 109 on the basis of print data supplied from the CPU and discharges ink at a specified print timing.

The body 102 comprises a cleaner 106 and a cap 107 in order to prevent ink from drying and being clogged in the ink-jet recording head 100 during printing. The cleaner 106 is used to wipe the ink on the ink-jet recording head 100. The cap 107 is used to place the ink-jet recording head 100 on it and to cap the ink-jet recording head 100 at this position when printing is stopped. The body 102 comprises the tray 103 on its back side and also comprises, in its inside, an automatic sheet feeder 105 for automatically feeding the paper 109 and ejecting the paper 109 from an outlet 104 on the front side of the body 102.

Figure 2:
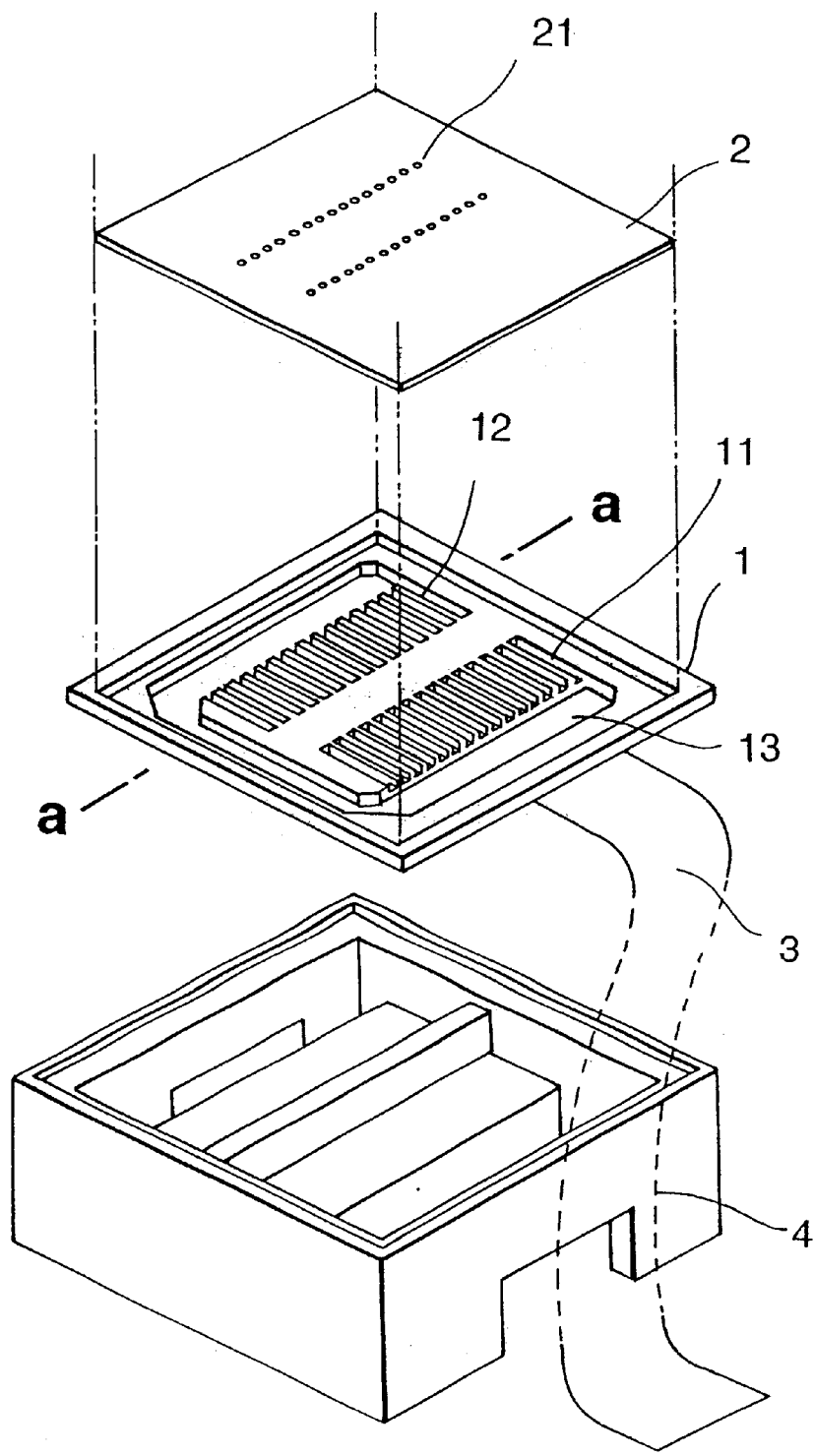
FIG. 2 is an exploded perspective view of an ink-jet recording head.

FIG. 2 shows an exploded perspective view of the ink-jet recording head. It shows a type with a common path for ink, which is provided in a pressure room substrate. As shown in FIG. 2, the ink-jet recording head is composed of a pressure room substrate 1, a nozzle plate 2, and a base 4. Etching processing and other treatment are given to a silicon single crystal substrate, which is then separated to form individual pressure room substrates 1. The pressure room substrate 1 is provided with a plurality of strap-shaped pressure rooms 11, and also comprises a common path 13 for supplying ink to all the pressure rooms 11. The pressure rooms 11 are separated by side walls 12. Piezoelectric film elements of this invention are provided on the base 4 side of the pressure room substrate 1. Lines from respective piezoelectric film elements are bundled by a wiring member 3, which is a flexible cable, and are thereby connected to an outside circuit of the base 4. The nozzle plate 2 is pasted on the pressure room substrate 1. At the positions in the nozzle plate 2 that correspond to the pressure rooms 11, nozzles 21 are formed for discharging ink drops. The base 4 is made of, for example, plastic or metal and serves as a mount for the pressure room substrate 1.

The principle of ink discharge is hereinafter explained with reference to FIG. 11(C). FIG. 11(C) is a sectional view of a principal part of the ink-jet recording head. It shows a section of the principal part as taken in a direction perpendicular to the lengthwise direction of the pressure rooms and corresponds to a sectional view taken along the line a—a in FIG. 2. The same structural components in FIG. 11(C) as those in FIG. 2 are given the same reference numerals and explanations thereof are omitted. Piezoelectric film elements 5 are formed over a substrate 10, which is composed of a silicon single crystal substrate, through a diaphragm 20 composed of an insulation film. The piezoelectric film element 5 comprises a piezoelectric film 40 held between an upper electrode 50 and a lower electrode 30. FIG. 11(C) shows the state where the lower electrode 30 is used as a common electrode. Application of desired voltage to the piezoelectric film element 5 causes changes in volume to the piezoelectric film 40, thereby pressing, through the diaphragm 20, the ink filled in the pressure room 11. Then, the ink filled in the pressure room 11 is discharged from the nozzle 21 and is then attached to specified recording paper, thereby enabling printing.

An embodiment of the piezoelectric film element of this invention is hereinafter explained with reference to FIGS. 3 through 7.

Figure 3:
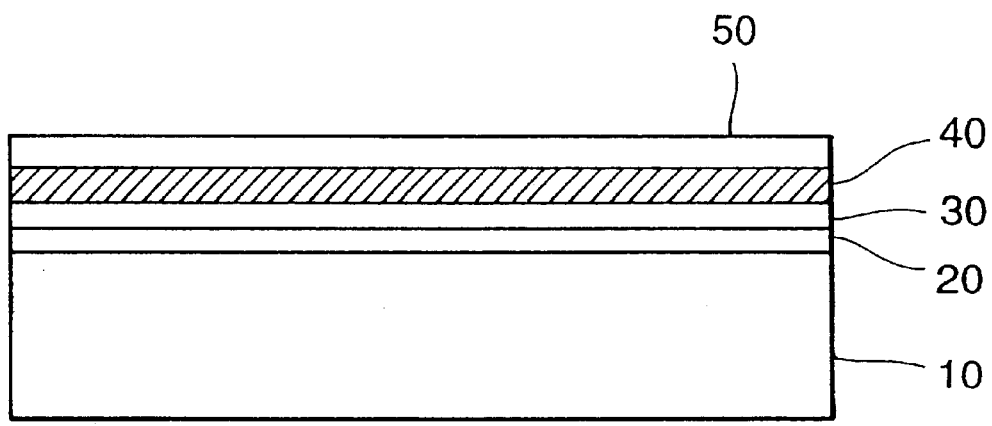
FIG. 3 is a sectional view of a piezoelectric film element.

As shown in FIG. 3, the piezoelectric film element of this invention is composed by forming, in the following order, the substrate 10 (film thickness: 220 $\mu$m), an oxide film 20 made of silicon dioxide (film thickness: 1.0 $\mu$m), the lower electrode 30 (film thickness: 0.58 $\mu$m), the piezoelectric film 40 (film thickness: 0.8 $\mu$m), and the upper electrode 50 (film thickness: 0.1 $\mu$m).

Although it is not specifically illustrated in the drawing, the lower electrode 30 has a multilayer structure consisting of: a titanium layer (film thickness: 20 nm), a titanium oxide layer (film thickness: 20 nm), a titanium layer (film thickness: 5 nm), a platinum layer (film thickness: 500 nm), and a titanium layer (film thickness: 5 nm) as listed from the substrate 10 side.

Explanations are hereinafter given about the steps of manufacturing the piezoelectric film element with reference to FIGS. 4 and 5.

Figure 4A:
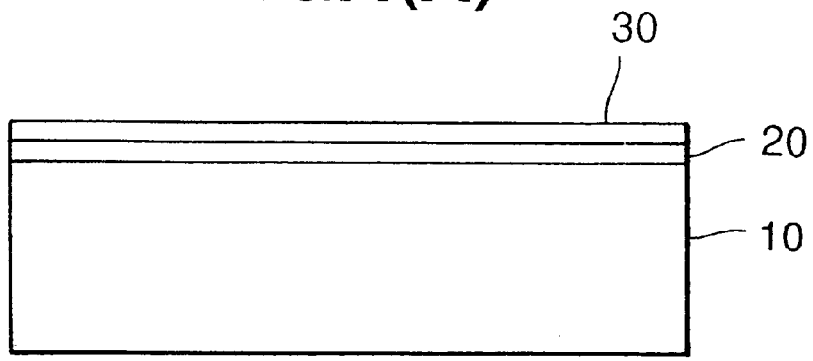
FIGS. 4(A)–4(C) shows sectional views illustrating the steps of manufacturing the piezoelectric film element.

As shown in FIG. 4(A), the oxide film 20 consisting of silicon dioxide with a film thickness of 1.0 $\mu$m is formed by thermal oxidation over the silicon single crystal substrate 10 with a thickness of 220 $\mu$m. In this step, the treatment is given at high temperatures in the oxidizing atmosphere containing oxygen or moisture. This oxide film 20 functions as the diaphragm. However, it is not limited to the silicon dioxide film, but a zirconium oxide film, a tantalum oxide film, a silicon nitride film, or an aluminum oxide film may be used. Moreover, the diaphragm itself may be eliminated and the lower electrode may also take the role of the diaphragm. The method of forming the oxide film 20 is not limited to the thermal oxidation, but a CVD method may be applied. A film forming method, such as a sputtering film forming method, is employed to form, over the surface of the oxide film 20, the lower electrode 30 consisting of: a titanium layer (film thickness: 20 nm), a titanium oxide layer (film thickness: 20 nm), a titanium layer (film thickness: 5 nm), a platinum layer (film thickness: 500 nm), and a titanium layer (film thickness: 5 nm) in the order listed above. These titanium layers serve to improve the adhesion between the lower electrode 30 and the oxide film 20.

Figure 4B:
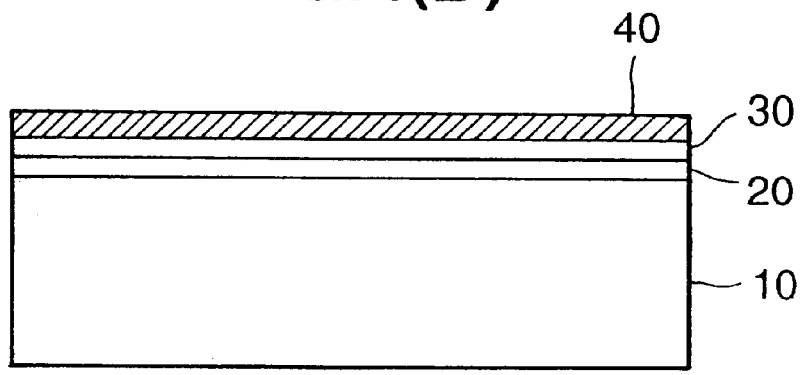

Referring to FIG. 4(B), the piezoelectric film 40 is formed over the lower electrode 30. In this embodiment, the sol-gel method is used to form the piezoelectric film 40. Concerning the piezoelectric film 40, any composition can be applied as long as piezoelectric ceramics having piezoelectric properties are used. For example, other than PZT type piezoelectric materials, materials with metal oxides added thereto, such as neobate, nickel oxides or magnesium oxides, can be applied. As specific examples, $PbTiO_3$, $Pb(Zr,Ti)O_3$, $PbZrO_3$, $(Pb, La)TiO_3$, $(Pb,La)(Zr,Ti)O_3$, or $Pb(Zr,Ti)(Mg,Nb)O_3$ can be applied. As the composition of the piezoelectric film 40, this embodiment employs, for example, $Pb(Zr_{0.56}Ti_{0.44})_{0.9}(Mg_{1/3}Nb_{2/3})_{0.1}O_3$. In order to make the piezoelectric film 40 with a thickness of 0.8 $\mu$m, spin coating of the sol for forming the piezoelectric film 40 is performed eight times and the drying and pyrolyzing steps are then taken.

Figure 5A:
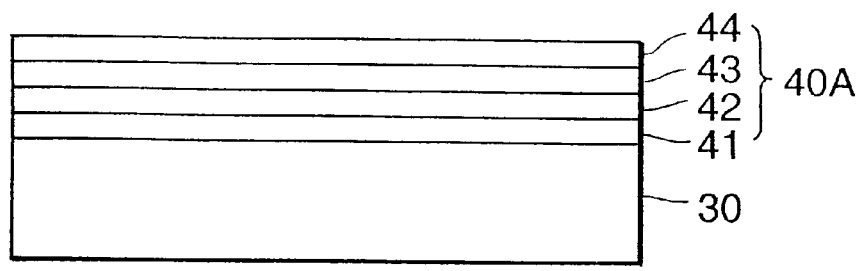
FIGS. 5(A)–5(C) shows sectional views of the manufacturing steps, which illustrate in more the steps of forming a piezoelectric film.

Specifically speaking, as shown in FIG. 5(A), spin coating of the sol for forming the piezoelectric film 40 is performed over the lower electrode 30 at 1500 rpm for 30 seconds to obtain a film thickness of 0.1 $\mu$m. The obtained film is dried for 10 minutes at the temperature of 180° C. and is then pyrolyzed for 30 minutes at the temperature of 400° C., thereby forming a piezoelectric layer 41. The same step is repeated twice to form piezoelectric layers 42 and 43. In this case, it is desirable that the Pb content in the sol for forming the piezoelectric layers 41, 42 and 43 be 1.05 mol %.

Subsequently, spin coating of a 1.2 mol % sol is performed over the piezoelectric layer 43 at 1500 rpm for 30 seconds. The obtained layer is dried at the temperature of 180° C. for 10 minutes and is then pyrolyzed at the temperature of 400° C. for 30 minutes, thereby forming a piezoelectric layer 44. At this time, the dislocation layer is formed by increasing the Pb content in the sol at the time of formation of the piezoelectric layer 44. However, the Pb content in the sol for forming the piezoelectric layer 44 may be the same as that in the sol for forming the piezoelectric layers 41, 42 and 43. In this case, the Pb content in the sol for forming all the piezoelectric layers 41 through 44 should be 1.09 mol % or more. In this case, a low dielectric layer generated in the piezoelectric layer 44 relaxes stress caused in the piezoelectric film.

Continuous thermal treatment (pre-annealing) by means of RTA (Rapid Thermal Annealing) is then given to the piezoelectric layers 41 through 44 in the oxygen atmosphere at the temperature of 550° C. for 5 minutes and continuously at the temperature of 675° C. for one minute, thereby forming a piezoelectric film 40A. This pre-annealing causes the lattice arrangement in the vicinity of the surface of the piezoelectric film 40A to sinter and crystallize in a disturbed state.

Figure 5B:
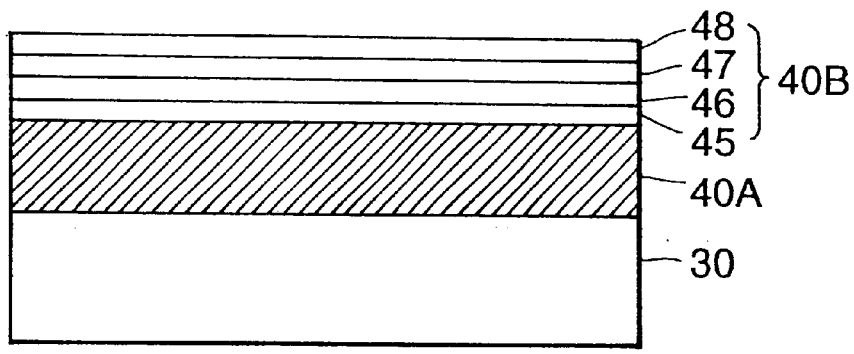
Figure 5C:
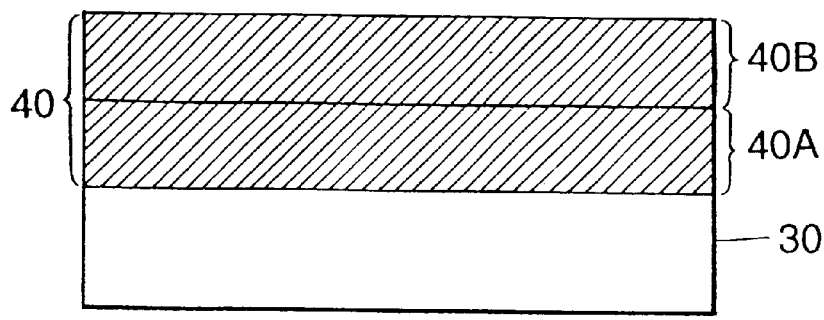

As shown in FIG. 5(B), the same steps as those of forming the piezoelectric layers 41 through 44 are taken to form piezoelectric layers 45 through 48 over the piezoelectric film 40A. It is desirable that the Pb content in a sol for forming the piezoelectric layers 45 through 47 be 1.05 mol % and the Pb content in a sol for forming the piezoelectric layer 48 be 1.2 mol %. After the formation of the piezoelectric layer 48, continuous thermal treatment (final annealing) by means of RTA is performed in the oxygen atmosphere at the temperature of 600° C. for 5 minutes and continuously at the temperature of 850° C. for one minute, thereby forming a piezoelectric film 40B. As a result, as shown in FIG. 5(C), the piezoelectric film 40 consisting of the piezoelectric films 40A and 40B is formed over the lower electrode 30.

Figure 6:
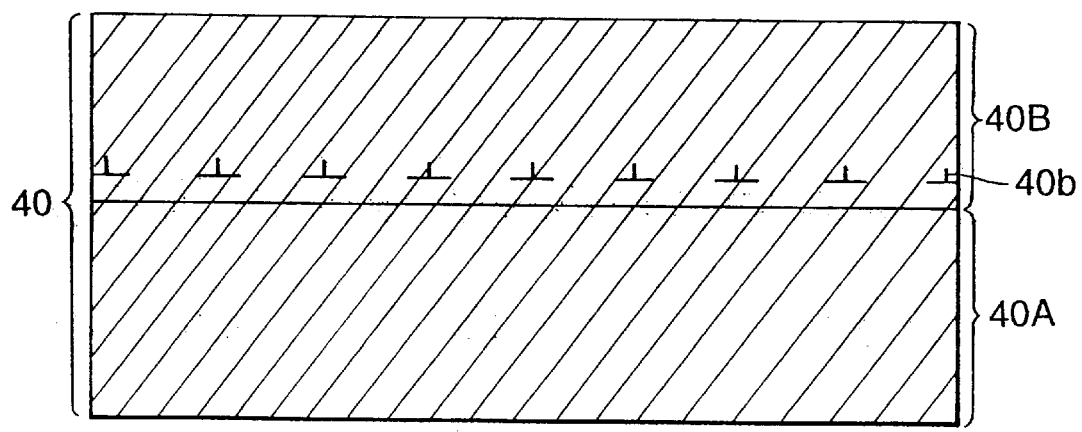
FIG. 6 is an explanatory drawing of a dislocation layer formed in the piezoelectric film.

In this case, since the lattice arrangement in the vicinity of the surface of the piezoelectric film 40A has sintered and crystallized in the disturbed state, the lattice arrangement of the piezoelectric film 40B is affected by the lattice arrangement in the vicinity of the surface of the piezoelectric film 40A and sinters and crystallizes in the state where lattice defects are generated. Accordingly, as shown in FIG. 6, a dislocation layer 40b including lattice defects is formed in the piezoelectric film 40B in the vicinity of an interface between the piezoelectric film 40A and the piezoelectric film 40B. As this dislocation layer 40b relaxes internal stresses caused at the time of formation of the piezoelectric film 40, it is possible to prevent the generation of cracks at the time of formation of the piezoelectric film.

Figure 7:
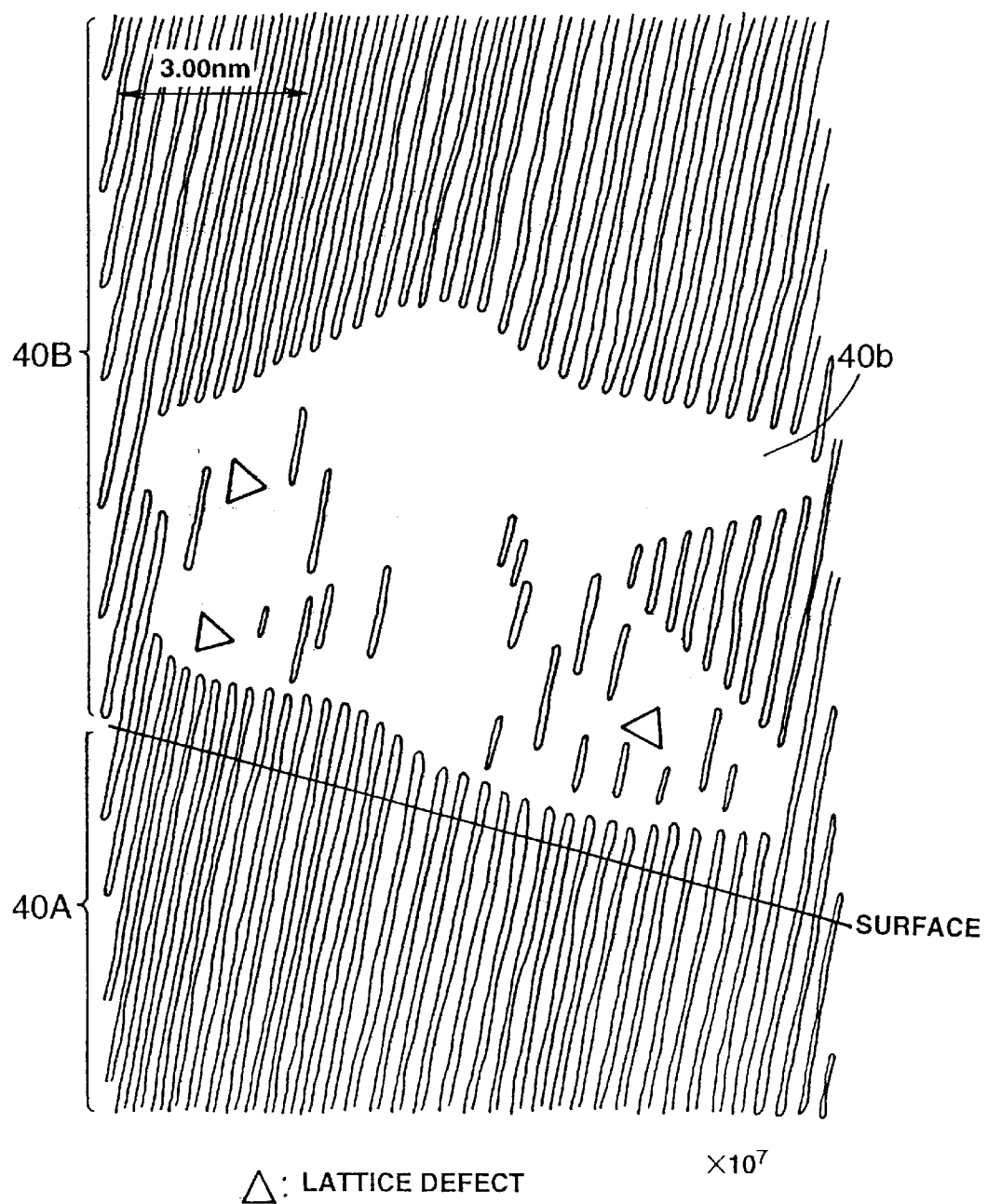
FIG. 7 is an explanatory drawing of a dislocation layer containing lattice defects.

FIG. 7 shows an enlarged view (of 10,000,000 magnifications) of the dislocation layer 40b formed in the piezoelectric film 40B which is formed under the conditions as described above. This drawing is a sketch of a high resolution cross-sectional TEM (XHRTEM) microphotograph. In this drawing, Δ indicates a lattice defect (dislocation of lattice) and a full line indicates the interface between the piezoelectric film 40A and the piezoelectric film 40B. This full line is the boundary above which the piezoelectric film 40B is located, and below which the piezoelectric film 40A is located. This drawing tells that there are many lattice defects in the vicinity of the interface. As a result of measurement, it is confirmed that the dislocation density of the dislocation layer formed by the lattice defects is within the range of $10^{13}/cm^2$ to $10^{14}/cm^2$ per unit area and the thickness of the dislocation layer 40b is about 10 nm. Since the dislocation density of a piezoelectric film with no dislocation layer 40b formed therein is from $10^{11}/cm^2$ to $10^{12}/cm^2$, the lattice defects in the dislocation layer 40b are about 100 times as many as those in the piezoelectric film without the dislocation layer.

Figure 4C:
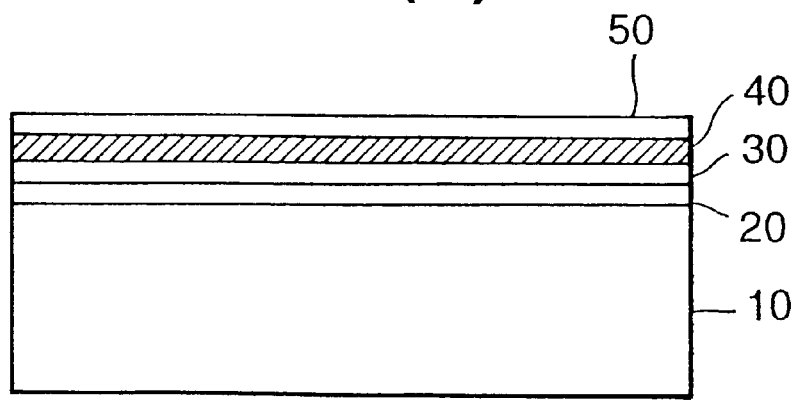

After the formation of the piezoelectric film 40, as shown in FIG. 4(C), the upper electrode 50 is formed over the piezoelectric film 40. This step is performed by forming a film of platinum with a thickness of 0.1 μm by means of direct current sputtering. Desired steps such as patterning are then taken, thereby obtaining a piezoelectric film element.

In the above explanation, coating of the sol is performed eight times to form the piezoelectric film 40. However, the number of times of the coating is not limited to eight times as long as the film can resist the stresses caused at the time of film formation. Similarly, the object of the pre-annealing is not limited to the fourth layer, but the pre-annealing can be conducted on any layer such as the second layer or the third layer.

Concerning the piezoelectric film element of this embodiment which is obtained by the above-described manufacturing method (when the lead contents in the fourth layer and the eighth layer of the piezoelectric film are increased), a piezoelectric constant $d_{31}$ of such a piezoelectric film element is 150 pC/N, a piezoelectric output coefficient $g_{31}$ is 11.0 mV·m/N, and a dielectric constant e is 1550. Concerning the piezoelectric film element of this embodiment which is obtained by the above-described manufacturing method (when the lead contents of all the layers of the piezoelectric film are made the same), the piezoelectric constant $d_{31}$ of such a piezoelectric film element is 150 pC/N, the piezoelectric output coefficient $g_{31}$ is 9.4 mV·m/N, and the dielectric constant e is 1803.

On the other hand, in a comparative example where the pre-annealing treatment is not performed at the time of formation of the piezoelectric film, cracks are generated at the time of formation of the piezoelectric film and the piezoelectric properties are not exhibited. Since the pre-annealing treatment is not performed at the time of formation of the piezoelectric film in the comparative example, no dislocation layer is formed and, therefore, the stresses generated within the piezoelectric film may not be relaxed. Accordingly, this piezoelectric film element has the structure in which cracks are easily generated within the thick piezoelectric film.

Consequently, since the piezoelectric film element of this embodiment has the structure including the lattice defects, it is possible to enhance the reliability of the piezoelectric film and to enhance the piezoelectric properties.

Another embodiment of the piezoelectric film element of this invention is hereinafter explained with reference to FIGS. 8 and 9.

In this embodiment, a plurality of dislocation layers are formed in the piezoelectric film. Specifically speaking, the dislocation layers are formed in unequal distances in the film thickness direction such that the distances between them gradually become shorter from the lower electrode side to the upper electrode side, or the dislocation layers are formed in equal distances in the film thickness direction, thereby making it possible to prevent the generation of cracks at the time of formation of the piezoelectric film and to increase the thickness of the piezoelectric film.

Figure 8:
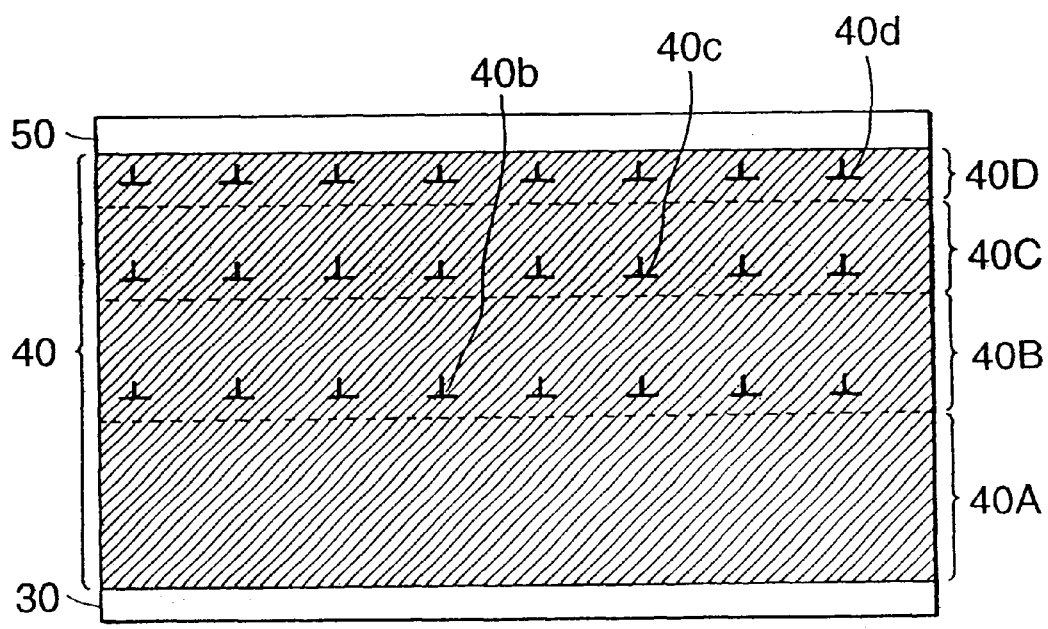
FIG. 8 is a sectional view of the piezoelectric film element.

As shown in FIG. 8, the piezoelectric film element is composed of the piezoelectric film 40 held between the upper electrode 50 and the lower electrode 30. Although details of the manufacturing steps will be described later, the piezoelectric film 40 is composed of: a piezoelectric layer 40A prepared by putting four layers of a piezoelectric film precursor one over another and by giving the pre-annealing treatment to the laminated four layers; a piezoelectric layer 40B prepared by giving the pre-annealing treatment to the laminated three layers of the precursor; a piezoelectric layer 40C prepared by giving the pre-annealing treatment to the laminated two layers of the precursor; and a piezoelectric layer 40D prepared by giving the pre-annealing treatment to one layer of the precursor.

By giving the pre-annealing treatment to the piezoelectric film precursor as described above, it is possible to form a dislocation layer 40b near an interface between the piezoelectric layer 40A and the piezoelectric layer 40B. In other words, as the pre-annealing treatment is given to the piezoelectric film precursor of the piezoelectric layer 40A, the lattice arrangement in the vicinity of the surface of the piezoelectric film precursor sinters and crystallizes in a disturbed state. Accordingly, as a result of the pre-annealing treatment given to the piezoelectric film precursor of the piezoelectric layer 40B formed over the piezoelectric layer 40A, the piezoelectric layer 40B sinters and crystallizes in the state affected by the disturbed lattice arrangement. Therefore, in the piezoelectric layer 40B in the vicinity of the interface between the piezoelectric layer 40A and the piezoelectric layer 40B, the dislocation layer (first dislocation layer) 40b with the lattice of perovskite crystal being partly defective is formed. A second dislocation layer 40c and a third dislocation layer 40d are formed in the same manner respectively on the piezoelectric layer 40C and the piezoelectric layer 40D. These dislocation layers can relax the internal stresses caused at the time of formation of the piezoelectric film 40.

Since cracks are normally generated at the time of formation of the piezoelectric film 40 from the surface of the film (on the upper electrode side) toward the inside of the film, the internal stress caused over the surface of the film is assumed to be the strongest. The inventors of this invention paid their attention to this point and, therefore, formed the dislocation layers with the same distances between them in the film thickness direction or with unequal distances between them in the film thickness direction in a manner such that the adjacent dislocation layers gradually become shorter from the lower electrode side to the upper electrode side.

The following relationship is established when $d_1$ indicates a distance between the top face of the lower electrode and the first dislocation layer 40b, $d_2$ indicates a distance between the first dislocation layer 40b and the second dislocation layer 40c, and $d_3$ indicates a distance between the second dislocation layer 40c and the third dislocation layer 40d:

$$d_1 \geq d_2 \geq d_3 \tag{1}$$

The number of dislocation layers is not limited to three, but an optional number, for example, n (n=1, 2, 3, 4, ...) of dislocation layers may be formed. If the number of the dislocation layers is increased too much, there is a possibility that the piezoelectric properties of the piezoelectric film may lower. Accordingly, the number of the dislocation layers is determined on the basis of the relationship with the thickness of the piezoelectric film. For example, it is desirable that, with the piezoelectric film with a thickness of 3.0 μm, the number of the dislocation layers be four. In this case, it is desirable that $d_1$ be within the range of 0.6 μm to 1.4 μm, $d_2$ be within the range of 0.4 μm to 1.2 μm, $d_3$ be within the range of 0.2 μm to 1.0 μm, and $d_4$ be within the range of 0.01 μm to 0.8 μm.

Even if the relational expression (1) is not strictly satisfied, such a piezoelectric film may be used as is formed in a manner such that the distances between the dislocation layers become shorter near the surface of the film. For example, if there are four dislocation layers, the following relationship (2) or (3) may be allowed:

$$d_1 = d_2 \geq d_3 \geq d_4 \tag{2}$$

$$d_1 \geq d_2 = d_3 \geq d_4 \tag{3}$$

If the distances between the dislocation layers are the same or become shorter as a whole from the lower electrode side to the upper electrode side, the direction of the greater-than signs in the expressions (1), (2) and (3) may be turned the other way. The distances between the dislocation layers and the number of the dislocation layers can be designed and changed as appropriate in accordance with the method of forming the piezoelectric film, the thickness of the piezoelectric film, and other miscellaneous conditions.

The steps of forming the piezoelectric film 40 are hereinafter explained with reference to FIG. 9. In this embodiment, explanations are given about the case where the sol-gel method is used to form the piezoelectric film 40. Concerning the piezoelectric film 40, any optional composition can be applied as long as piezoelectric ceramics having piezoelectric properties are used. For example, other than PZT type piezoelectric materials, materials with metal oxides added thereto, such as neobate, nickel oxides or magnesium oxides, can be applied. As specific examples, $PbTiO_3$, $Pb(Zr,Ti)O_3$, $PbZrO_3$, $(Pb,La)TiO_3$, $(Pb,La)(Zr,Ti)O_3$, or $Pb(Zr,Ti)(Mg,Nb)O_3$ can be applied.

In this embodiment, the piezoelectric film is formed by means of the sol-gel method by using a precursor of a PZT type piezoelectric film which is a mixture of lead titanate and lead zirconate at a mole mixing ratio of 44%:56% and by repeating the coating, drying and pyrolyzing for the desired number of times (for example, ten times) until the film thickness finally reaches 1.0 μm. The piezoelectric film precursor can acquire the piezoelectric properties of practical use if X and Y in the following composition expression (1) are selected within the range shown in the expressions (2):

$$Pb_X Ti_Y Zr_Z O_3 (Y+Z=1) \tag{1}$$

$$1.00 < X < 1.20 \text{ and } 0.4 < Y < 0.6 \tag{2}$$

In order to obtain the desired thickness of the piezoelectric film 40, the spin coating of a sol for forming the piezoelectric film 40 is performed for the number of times (for example, ten times) and the drying and pyrolyzing steps are then taken. Specifically speaking, the piezoelectric film 40 is formed as described below.

Figure 9A:
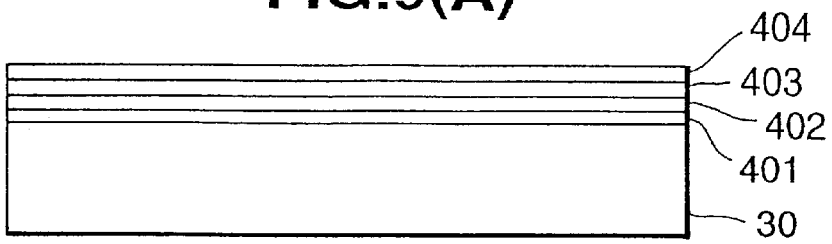
FIGS. 9(A)–9(D) shows sectional views illustrating the steps of manufacturing the piezoelectric film element.

As shown in FIG. 9(A), the spin coating of the sol for forming the piezoelectric film 40 is performed over the lower electrode 30 at 1500 rpm for 30 seconds to obtain a film thickness of 0.1 μm. The obtained film is dried at the temperature of 180° C. for 10 minutes and is then pyrolyzed at the temperature of 400° C. for 30 minutes, thereby forming a piezoelectric film precursor 401. The same step is repeated three times to form piezoelectric film precursors 402, 403 and 404.

In this case, it is desirable that the lead content in the piezoelectric film precursor 404 be more than that in the piezoelectric film precursors 401 through 403. For example, the lead content in the piezoelectric film precursors 401 through 403 is set as 1, while the lead content in the piezoelectric film precursor 404 is set as 1.15. However, the Pb content in the sol for forming the piezoelectric film precursor 404 may be the same as that in the sol for forming the piezoelectric film precursors 401, 402 and 403. In this case, the Pb content in the sol for forming all the piezoelectric film precursors 401 through 404 should be 1.09 mol % or more.

Continuous thermal treatment (pre-annealing) by means of RTA is then given to the piezoelectric film precursors 401 through 404 in the oxygen atmosphere at the temperature of 550° C. for 5 minutes and continuously at the temperature of 675° C. for one minute, thereby forming a piezoelectric layer 40A. This pre-annealing causes the lattice arrangement in the vicinity of the surface of the piezoelectric layer 40A to sinter and crystallize in a disturbed state.

Figure 9B:
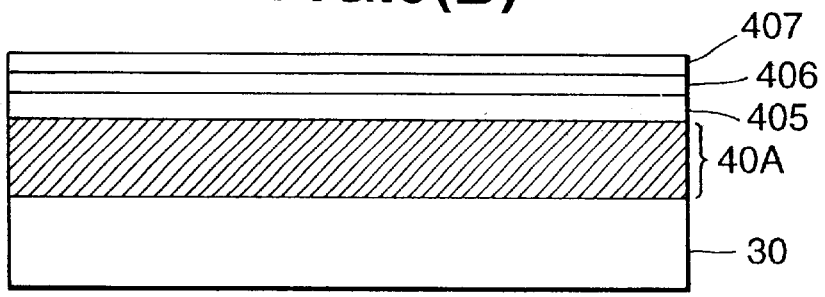

As shown in FIG. 9(B), the same steps as those of forming the piezoelectric film precursors 401 through 404 are taken to form piezoelectric film precursors 405, 406 and 407 over the piezoelectric layer 40A, and continuous thermal treatment (pre-annealing) by means of RTA is then performed in the oxygen atmosphere at the temperature of 600° C. for 5 minutes and continuously at the temperature of 850° C. for one minute, thereby forming a piezoelectric film 40B. It is possible to make the thickness of the piezoelectric layer 40B less than the thickness of the piezoelectric layer 40A by making the thicknesses of the respective piezoelectric film precursors 405 through 407 the same as those of the respective piezoelectric film precursors 401 through 404. When the amount of the sol to be applied is fixed as described above, it is possible to adjust the thicknesses of the piezoelectric layers by the number of times of spin coating. It is also possible to change the thicknesses of the piezoelectric layers by fixing the number of times of spin coating and by adjusting the concentration of the sol to be applied as appropriate.

As described above, the lead content in the piezoelectric film precursor 407 may be adjusted as appropriate. Since the lattice arrangement in the vicinity of the surface of the piezoelectric layer 40A has sintered and crystallized in the disturbed state, the lattice arrangement of the piezoelectric layer 40B is affected in the above-described step by the lattice arrangement in the vicinity of the surface of the piezoelectric layer 40A and sinters and crystallizes in the state where lattice defects are generated. Accordingly, as shown in FIG. 8, a dislocation layer 40*b* is formed in the piezoelectric layer 40B in the vicinity of an interface between the piezoelectric layer 40A and the piezoelectric layer 40B.

Figure 9C:
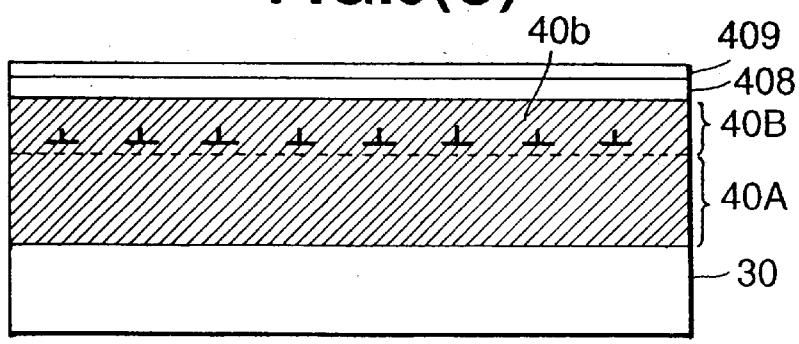

As shown in FIG. 9(C), piezoelectric film precursors 408 and 409 are formed over the piezoelectric layer 40B, and the continuous thermal treatment (pre-annealing) by means of RTA is then performed in the oxygen atmosphere at the temperature of 600° C. for 5 minutes and continuously at the temperature of 850° C. for one minute, thereby forming a piezoelectric film 40C. In this case, the film thickness of the piezoelectric film 40C is less than that of the piezoelectric film 40B. As stated above, the lead content in the piezoelectric film precursor 409 may be adjusted as appropriate. As a result of this step, as shown in FIG. 8, a dislocation layer 40*c* is formed within the piezoelectric layer 40C.

Figure 9D:
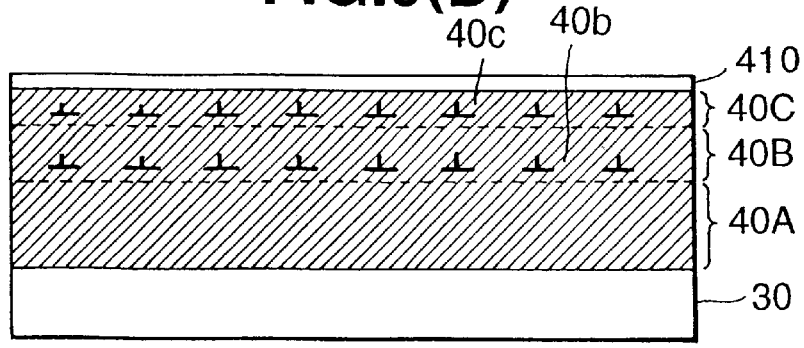

As shown in FIG. 9(D), a piezoelectric film precursor 410 is formed over the piezoelectric layer 40C, and the continuous thermal treatment (final annealing) by means of RTA is then performed in the oxygen atmosphere at the temperature of 600° C. for 5 minutes and continuously at the temperature of 850° C. for one minute, thereby forming a piezoelectric film 40D. In this case, the film thickness of the piezoelectric film 40D is less than that of the piezoelectric film 40C. As stated above, the lead content in the piezoelectric film precursor 410 may be adjusted as appropriate. As a result of this step, as shown in FIG. 8, a dislocation layer 40*d* is formed within the piezoelectric layer 40D. In the above-described manner, it is possible to form the piezoelectric film 40 which comprises three dislocation layers 40*b*, 40*c* and 40*d*.

Concerning the piezoelectric film element of this embodiment which is obtained by the above-described manufacturing method, the piezoelectric constant $d_{31}$ of such a piezoelectric film element is 140 pC/N, the piezoelectric output coefficient $g_{31}$ is 11 mV·m/N, and the dielectric constant is 1500. on the other hand, with the piezoelectric film prepared by the conventional manufacturing method, if the film thickness of the piezoelectric film is made 0.4 µm or more, cracks are generated at the time of formation of the piezoelectric film and the obtained piezoelectric film does not exhibit the piezoelectric properties.

As described above, the piezoelectric film element according to this embodiment is composed in a manner such that the dislocation layers are formed with the same distances between them in the film thickness direction of the piezoelectric film, or such that the distances between the dislocation layers in the film thickness direction gradually become shorter. Therefore, it is possible to prevent the generation of cracks in the steps of forming the piezoelectric film and to enhance the reliability of the piezoelectric film without lowering the piezoelectric properties. Accordingly, it is possible to reduce the costs for manufacturing the piezoelectric film element. Moreover, it is possible to increase the thickness of the piezoelectric film.

The subscript 31 used in this specification indicates that the value shown with the subscript 31 is obtained with respect to the film thickness direction.

The piezoelectric film element of this invention can be applied to, other than pressing sources for ink-jet recording heads, ferroelectric elements such as nonvolatile semiconductor storage, thin film capacitors, pyroelectricity detectors, sensors, surface elasticity wave optical waveguides, optical storage, space light modulators, and diode laser frequency doublers.

The steps of manufacturing the ink-jet recording head are hereinafter explained with reference to FIGS. 10 and 11.

FIGS. 10 and 11 correspond to sectional views of the pressure room substrate 1 as taken along the line a—a in FIG. 2.

Figure 10A:
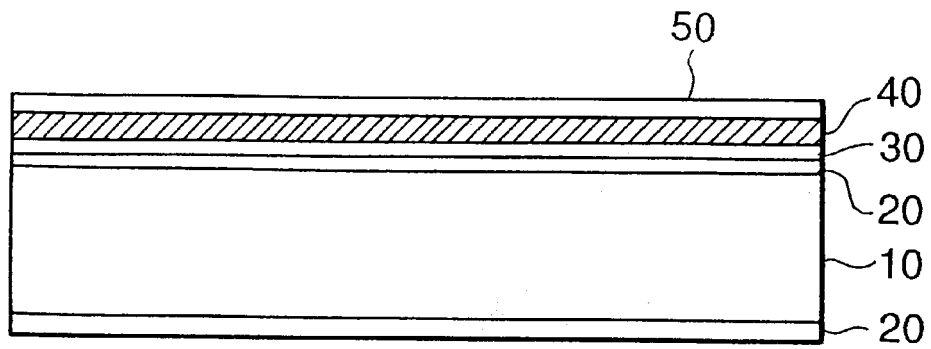
FIGS. 10(A)–10(C) shows sectional views illustrating the steps of manufacturing a principal part of the ink-jet recording head.

As shown in FIG. 10(A), thermal oxidation or other method is applied to the entire surface of a silicon single crystal substrate 10 of specified size and thickness (e.g., 102 mm in diameter and 220 µm thick) to obtain an etching protective layer (thermal oxidized film) 20 made of silicon dioxide.

Subsequently, the lower electrode 30, the piezoelectric film 40 and the upper electrode 50 are formed on the active element side (the side where the piezoelectric film element is formed) of the substrate 10. As a specific method for forming these films is as described above, the explanation thereof is omitted.

Figure 10B:
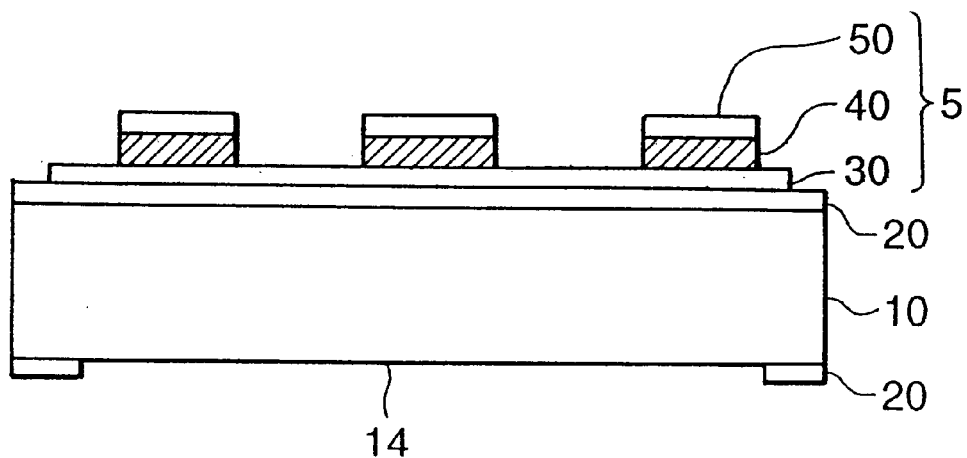

As shown in FIG. 10(B), an appropriate resist (not shown) is applied to the upper electrode 50 and the piezoelectric film 40 at positions corresponding to the positions where the pressure rooms 11 are to be formed. This resist is used as a mask to perform, for example, ion milling in order to form the upper electrode 50 and the piezoelectric film 40 in separated shapes. For the formation of this resist, any known method such as a spinner method or a spray method may be used. Moreover, an appropriate resist (not shown) is applied in the same manner to the lower electrode 30 and ion milling or other method is employed to form the lower electrode 30 in a specified shape. As a result of this step, the piezoelectric film elements 5 are formed separately at positions corresponding to the respective pressure rooms.

On the active element side of the substrate 10, a protective film (not shown) is formed against various chemicals used in the subsequent step. Etching is performed with hydrogen fluoride on the thermal oxidized film 20 in its surface area including at least the pressure rooms or side walls on the pressure room side of the substrate 10, thereby forming an opening 14 for etching.

Figure 10C:
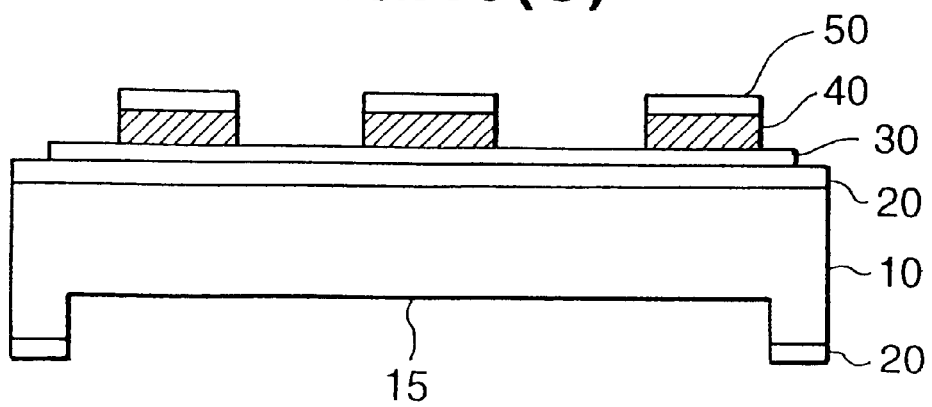

As shown in FIG. 10(C), a wet anisotropy etchant, for example, an aqueous potassium hydroxide solution (concentration: 10%) with its temperature retained at 80° C. is used to etch the silicon single crystal substrate 10 at the opening 14 until a specified depth is obtained, thereby forming a concave 15. This step may be taken by means of dry anisotropy etching using active gas, such as parallel plane plate reactive ion etching.

Figure 11A:
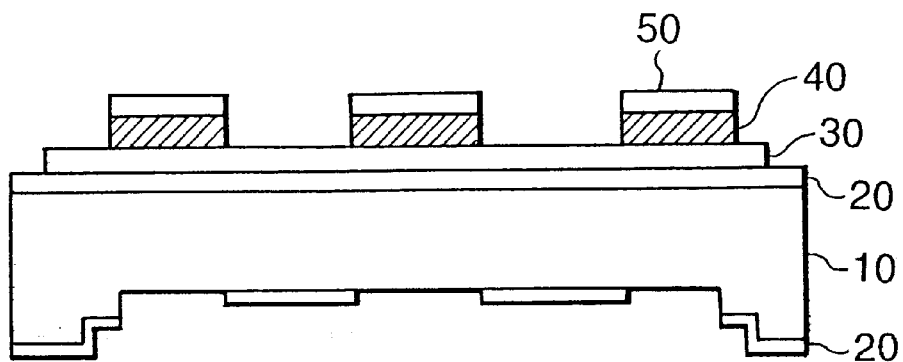
FIGS. 11(A)–11(C) shows sectional views illustrating the steps of manufacturing the principal part of the ink-jet recording head.

As shown in FIG. 11(A), a chemical vapor phase epitaxy method such as a CVD method is employed on the substrate 10 with the concave 15 formed therein to form a silicon dioxide film 20 with a thickness of 1 µm as an etching protective layer. Then, an etching mask is applied at positions corresponding to the positions where the press rooms are to be formed and the etching is performed with hydrogen fluoride. The sol-gel method may be used as another method for forming the silicon dioxide film 20. However, since the piezoelectric film elements are already formed on the surface on the active element side, the sol-gel method which requires high temperature heating at 1000° C. or more is not preferred because it will inhibit the crystalline properties of the piezoelectric film.

Figure 11B:
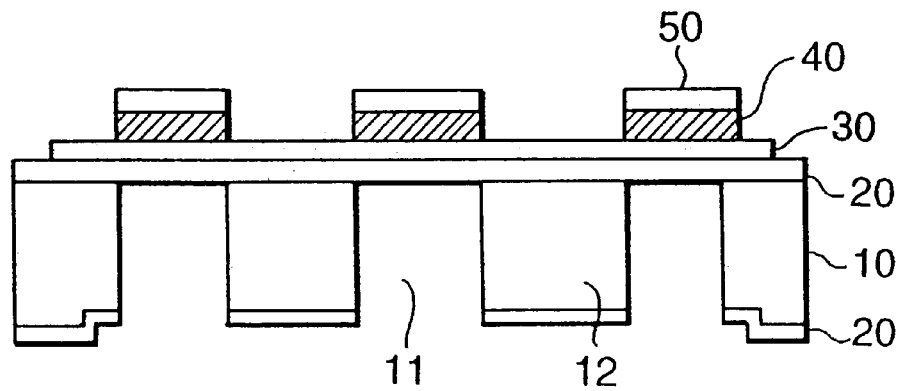
Figure 11C:
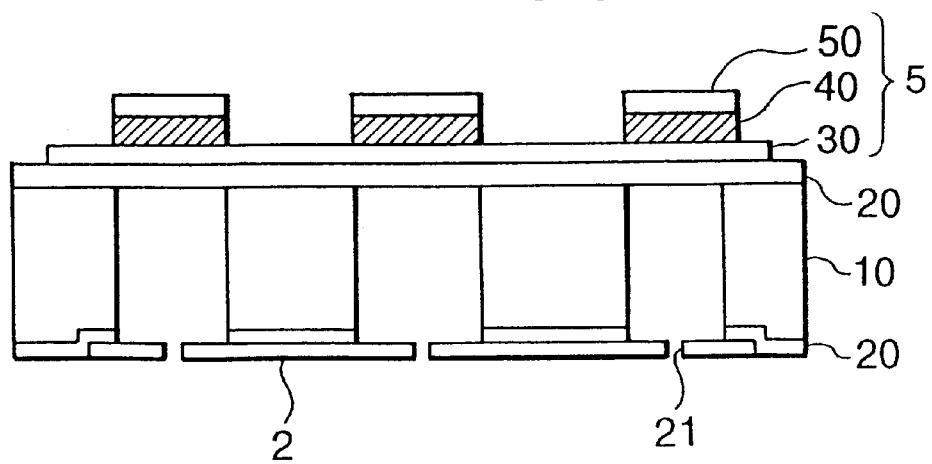

As shown in FIG. 11(B), a wet anisotropy etchant, for example, an aqueous potassium hydroxide solution (concentration: 10%) with its temperature retained at 80° C. is used to perform anisotropy etching of the substrate 10 from the pressure room side toward the active element side, thereby forming the pressure rooms 11 and the side walls 12.

As shown in FIG. 11(C), a nozzle unit 2 which is a separate part is bonded to the substrate 10 by using an adhesive. As this adhesive, any one of the epoxy type, urethane type and silicon type may be used. This nozzle unit 2 has nozzles 21 formed therein which correspond to the respective pressure rooms 11. The pressure room substrate 1 and the nozzle unit 2 may be formed integrally by etching the silicon single crystal substrate. In this case, the above-described step is unnecessary.

What is claimed is:

1. A method for manufacturing a piezoelectric film element comprising the steps of:
   (a) applying a sol n times to a lower electrode whereby n piezoelectric film precursors are formed;
   (b) thermally treating the precursors thereby forming a piezoelectric film layer;
   (c) repeating steps (a) and (b) not less than two times whereby a dislocation layer is formed near an interface of successive piezoelectric film layers; and
   (d) holding equal or reducing the number of sol coatings (n) in each successive repeat of step (a), wherein at least one of the successive steps reduces the number of sol coatings (n), such that the piezoelectric film layer thickness decreases in the direction from the lower electrode to an upper electrode.

2. The method for manufacturing a piezoelectric film element according to claim 1, wherein the following relationship is established when the number (m) of dislocation layers are named, in the order beginning from the dislocation layer closest to the lower electrode side, a first dislocation layer, a second dislocation layer and so on until an $m^{th}$ dislocation layer, and when $d_1$ indicates a distance between the top face of the lower electrode and the first dislocation layer, $d_2$ indicates a distance between the first dislocation layer and the second dislocation layer, and so on until $d_m$ indicates a distance between the m−1 dislocation layer and the $m^{th}$ dislocation layer:

$$d_1 \geq d_2 \geq \ldots d_m$$

wherein the relationship between at least one of the pairs of distances noted above is such that the distance between disclocation layers closer to the lower electrode is greater than the distance between subsequent dislocation layers, for example, $d_1 > d_2$.

3. The method for manufacturing a piezoelectric film element according to claim 2, wherein a dislocation density in the dislocation layer is within the range of $10^{13}/cm^2$ to $10^{14}/cm^2$.

4. The method for manufacturing a piezoelectric film element according to claim 3, wherein the dislocation layer is formed with a thickness ranging from 5 nm to 15 nm in a thickness direction of the piezoelectric film.

5. A method for manufacturing an ink-jet recording head, comprising the steps of:

forming a pressure room in a pressure room substrate; and
   manufacturing a piezoelectric film element at a position which makes it possible to press the pressure room by the method for manufacturing a piezoelectric film element as stated in any one of claims 1 through 4.

* * * * *